United States Patent [19]

Murarka et al.

[11] Patent Number: 4,837,044
[45] Date of Patent: Jun. 6, 1989

[54] RUGATE OPTICAL FILTER SYSTEMS

[75] Inventors: Narayan P. Murarka, Hoffman Estates; Kent J. Kogler, Orland Park; Craig S. Bartholomew, Glen Ellyn, all of Ill.; Howard T. Betz, Chesterton, Ind.; Richard J. Harris, Bellbrook, Ohio

[73] Assignee: ITT Research Institute, Chicago, Ill.

[21] Appl. No.: 6,661

[22] Filed: Jan. 23, 1987

[51] Int. Cl.$^4$ .............................. B05D 3/06; B05D 5/06
[52] U.S. Cl. ..................................... 427/10; 427/53.1; 427/162; 427/167
[58] Field of Search ................. 427/10, 162, 167, 53.1

[56] References Cited

U.S. PATENT DOCUMENTS

| | | | |
|---|---|---|---|
| 2,771,055 | 11/1956 | Kelly et al. | 427/10 |
| 2,936,732 | 5/1960 | Ring et al. | 427/10 |
| 3,926,508 | 12/1975 | Harmsen et al. | 427/10 |
| 4,049,352 | 9/1977 | Lardon et al. | 427/10 |
| 4,311,725 | 1/1982 | Holland | 427/10 |
| 4,427,723 | 1/1984 | Swain | 427/53.1 |
| 4,469,713 | 9/1984 | Schwiecker et al. | 427/10 |
| 4,545,646 | 10/1985 | Chern et al. | 427/167 |
| 4,707,611 | 11/1987 | Southwell | 250/560 |
| 4,711,790 | 12/1987 | Morishige | 427/10 |
| 4,713,140 | 12/1987 | Tien | 427/10 |
| 4,770,895 | 9/1988 | Hartley | 427/10 |

FOREIGN PATENT DOCUMENTS 1364093  5/1964  France .................... 427/10

OTHER PUBLICATIONS

Balasubramanian, et al., "J. Vac. Sci. Technol", vol. 9, No. 3, May–Jun. 1972.

Primary Examiner—Norman Morgenstern
Assistant Examiner—Marianne L. Padgett
Attorney, Agent, or Firm—Fitch, Even, Tabin & Flannery

[57] ABSTRACT

A method for fabricating graded refractive index (rugate, optical filters as well as complex rugate filters having prespecified refractive index verses thickness profiles is disclosed. A plurality of at least two different compatable thin film deposition source components of different refractive index, which are stoichiometrically combinable in variable proportion, such as silicon nitride and silicon oxide, or zinc sulfide and zinc selenide, are used to form a thin film material with a refractive index which varies as a function of the proportions of the components. Each source component is separately laser flash evaporated and codeposited on a substrate to form a coating while monitoring the physical and optical thicknesses of the coating, to allow adjustment of the respective laser flash evaporation rates of the source components.

5 Claims, 7 Drawing Sheets

FIG. 6 VIS-NIR SPECTRA OF FABRICATED RUGATE FILTER ON POLYCARBONATE. SOLID LINE IS TRANSMITTANCE AND DASHED LINE IS REFLECTANCE (100=90%)

FIG. 7 THICKNESS MONITOR

RUGATE OPTICAL FILTER SYSTEMS

This invention was made with Government support under Air Force Contract No. DLA900-80-C-2853. The Government has certain rights in this invention.

BACKGROUND OF THE INVENTION

The present invention is directed to methods and apparatus for the design and fabrication of graded refractive index (rugate) optical filters as well as to complex rugate filters having prespecified refractive index versus thickness profiles.

The term "filter" is used herein in a comprehensive sense to include active and passive absorption devices, transmission devices and/or reflection devices. Typically, such optical filter devices function in a wavelength range which is at least in part within the visible, near UV and/or near IR electromagnetic spectrum range.

Optical filters are conventionally provided by depositing alternating layers of dielectric materials of different refractive index, having the respective layers being of a thickness determined in the desired constructive or destructive interference desired at the wavelength(s) of interest. In order to provide various optical filter functions, a plurality of dielectric stacks each of different optical filtering properties are conventionally provided in adjacent array. However, such composite optical filter devices have disadvantages of undesirably low efficiency and discrimination capability. Improved optical filters of increased efficiency, filter function complexity and/or discrimination capacity would be desirable.

Optical filters are conventionally manufactured by depositing dielectric layers on a suitable substrate, such as a reflective or transparent substrate. The monitoring and controlling of the deposition process is a limiting factor in the manufacture and performance of optical filters.

Monitoring of deposit thickness and refractive index during deposition have utilized reflectance monitoring combined with a crystal thickness monitoring, elipsometric monitoring, interferometric monitoring or a combination of these techniques. Conventionally, reflectance monitoring measures only the optical thickness (nt) rather than the physical thickness (t). In order to obtain individual values for both the index of refraction (n) and physical thickness, a crystal thickness monitor which varies in oscillation frequency with increasing deposit thickness may be used to measure the physical thickness (t) of the deposited films, permitting calculation of the index of refraction from the reflectance monitor. However, crystal monitors tend to have limited accuracy, and can accommodate only a limited deposit thickness. Removing the deposit or replacing the crystal monitor may require breaking of the deposition chamber vacuum, thereby increasing the potential for impurities in the deposited film.

Elipsometric measurement techniques utilize iterative solution of transcendental functions to obtain values for n and t, which prolongs measurement response time and expense, and presents difficulties in respect to deposition-time error correction. In addition, elipsometric measurement accuracy decreases with increasing film thickness, which conventionally may require the use of witness coupons that must be replaced after a short number of fabrication cycles.

Interferometric monitors are also conventionally utilized to control or monitor layer deposition in the fabrication of optical filters. However, while interferometry potentially has several advantages over reflectance and elipsometric monitoring techniques, conventional interferometric monitoring systems have disadvantages with respect to the efficient, rapid and accurate determination of both refractive index and thickness of the deposited layer(s) of an optical filter during fabrication.

Accordingly, it is an object of the present invention to provide new optical filters, particularly such filters which provide complex optical filtering functions, and methods for designing and fabricating such filters. It is a further object to provide methods and apparatus for rapidly and accurately measuring the thickness and the refractive index of optical filters. It is another object to provide methods and apparatus for fabricating optical filters in which the layer thickness and refractive index are continuously monitored and in which the deposition is controlled in response to the measured thickness and refractive index values. These and other objects wil be apparent from the following description and the accompanying drawings.

DESCRIPTION OF THE INVENTION

Various aspects of the present invention are directed to graded refractive index (rugate) optical filters and methods and apparatus for designing and fabricating such filters. Graded refractive index optical filter devices generally comprise film material with a refractive index continuously varying as a function of thickness to provide a desired optical filter functional response. The refractive index variation with film thickness can be designed to cause a reflection or transmission band at a desired wavelength, as will be described in more detail hereinafter.

The attainment of rugate filter bands occurs due to the addition of inphase reflections from multiple layers of varying refractive index. At particular wavelengths, the reflected radiation adds in-phase to provide high transmission or reflection. The design condition for high reflectance is that the period of the rugate structure equals half the wavelength of the radiation to be reflected. For low reflectance, the period should be equal to the wavelength of the radiation to be transmitted. The width of the spectral range over which high transmission or reflection is to occur increases with the amplitude of the rugate index profile. The magnitude of transmission or reflectance increases with the index amplitude and the number of rugate cycles in the coating. This is similar in some respects to conventional stack coatings in which similar relations hold as the difference in index of alternating layers and the number of layers increases. However, there are major differences in the way conventional stack and rugate coatings are physically realized. In rugate coatings, the discontinuous material interfaces are replaced by a controlled homogeneous refractive index profile in the coating. This is achieved by changing the stoichiometry of the material as the film is grown.

Rugate filters provide several significant advantages over quarterwave dielectric stacks. Below is a comparison of properties between the two filters:

|  | Quarter-Wave Stack | Rugate |
| --- | --- | --- |
| Structure | Many layers of stressed dissimilar materials | Nearly homogeneous |
| Optical Index Selection | Limited to existing film materials | Graded through alloy mixing |
| Bandwidth | Limited by practical materials indices to $>2.5\% \lambda_{rej}$ | Very narrow |
| Optical Density (OD) | Limited by number of layers to $\leq 3$ | With increased thickness, higher ODs are achievable |
| Field of view | Comparable to rugates | Comparable to stacks |
| Sideband effect | Reduced through complex stack designs | Substantially Eliminated through gaussian damping of index profile |
| Multiple rejection bands | not practical (except by sandwiching) | Multiple bands permitted |
| Physical integrity | Limited by adhesion, residual stress, and thermal mismatch | Approaches that of monolithic optical crystals |
| Laser Damage Threshold | Limited by dissimilar material interfaces | Potentially very high |

Suitable optical filter devices include narrow band reflection filters (high OD), narrow band transmission filters, multi-line (pass/stop) filters, anti-reflection (AR) coatings, high-reflection (HR) coatings, tuned filters, beam splitters, aperture sharing elements, broad stop band filters, and side band suppression filters.

The present invention is also directed to methods and apparatus for fabricating rugate filters having a predetermined refractive index and thickness profile. Important components of the synthesis process include the synthesis system, a real-time monitoring system for measuring both thickness and refractive index during deposition, and a control system for controlling the deposition process based on the measured values. The filter design system is also provided for design of the thickness and composition parameters of rugate filters having preselected optical properties. As synthesis proceeds, the real-time optical monitoring system independently determines the refractive index (n) and the thickness (t). The measured values of n and t are then compared with the desired values (previously stored) and an error signal is generated to drive the process parameters of the synthesis system. The process is continued until the complete filter is fabricated.

The manufacture of optical filters and the like requires the ability to accurately monitor both the thickness and refractive index during deposition of optical film materials. The accuracy and speed with which this monitoring must be accomplished depends on the center wavelength of the filter, the complexity of the index profile, the rate of deposition, and the refractive index of the materials being deposited. In the simple example of a single line filter, the total optical path of one cycle is smaller for shorter wavelengths implying a more rapid variation of the refractive index. Similarly, if high index materials are being deposited, the physical thickness of one cycle is smaller than for low index materials. For more complex index profiles, e.g., a multiline filter, the refractive index is also likely to vary rapidly.

The interferometer reads physical and optical thickness directly and n is determined from a closed form equation involving only one division operation. This means that deposition-time error correction is quite simple. Interferometers are provided in accordance with the present invention which directly monitor the optical filter and its substrate, eliminating possible errors in calibration between the substrate and a witness. The provision of such interferometers permits monitoring of the optical filter throughout the entire deposition process without breaking vacuum. If a heterodyning interferometer is used, as will be more fully described hereinafter, the accuracy is of the order of Angstroms. The speed of operation of such heterodyning interferometers is dependent on the heterodyne frequency, and accordingly, millisecond sampling times may be provided, which are beneficial to rapid and efficient process feedback control.

The determination of the thickness and refractive index profile for a desired rugate device may be carried out, for example, by Fourier synthesis or sinusoidal design techniques. In this regard, computer algorithms may be utilized which take a desired input spectrum, and calculate the refractive index profile that will provide the closest approximation to the desired optical filter function for the intended spectrum by transforming the index requirement from the frequency to the spatial domain. The design of the rugate coating may be defined in terms of four independent parameters: the number of cycles (M), the average index (Na), the index difference ($\Delta N$) and the period (P).

In the manufacture of a rugate device for a particular spectral filtering purpose, a refractive index versus film thickness profile is calculated which will meet the desired spectral requirements. By such suitable Fourier synthesis or sinusoidal design techniques, the performance of an optical filter for particular parameters of the change in peak-to-peak refractive index, number of modulation cycles, peak reflectivity and fractional bandwidth may be maximized for a selected material system.

The range of the achieveable refractive index for a selected material system is an important factor in the rugate design and performance. In accordance with various aspects of the present invention, multi-maxima graded refractive index optical filter devices are provided in which the refractive index of the device varies along the optical path in a manner which provides a desired optical processing function. Such optical devices will generally have at least about 5, and typically from about 10 to about 100 or more local refractive index maxima in the refractive index profile along the optical path of the optical filter device. By designing suitable refractive index profiles, efficient, as well as complex optical processing functions may be provided. Such refractive index gradations may be produced by depositing materials of varying composition in which the refreactive index is a function of the composition deposited. For example, the system $ZnS_xSe_{1-x}$ (mixed zinc, sulfide-selenide) provides compositions to be deposited which vary smoothly in composition and refractive index from that of pure zinc sulfide (ZnS), to that of pure zinc selenide (ZnSe), with appropriately varying refractive index. Similarly, the silicon dioxide-silicon nitride system permits deposition of homogeneous compositions which range from that of substantially pure silicon dioxide ($SiO_2$) to that of substantially pure silicon nitride ($Si_3N_4$). Another useful material system is the aluminum oxide-aluminum nitride system with compositions and refractive indices which range from substantially pure alumina to substantially pure aluminum nitride. A wide variety of other material systems similarly exhibit an index of refraction variation by stoichiometric variation and may be deposited on a suitable substrate in accordance with the present invention to provide rugate optical devices. As will be discussed hereinafter, a wide range of substrate materials may also be utilized for the rugate coating.

Having generally described the various aspects of the present invention, the invention will now be more particularly described with respect to the various specific embodiments of the drawings.

Figure 1:
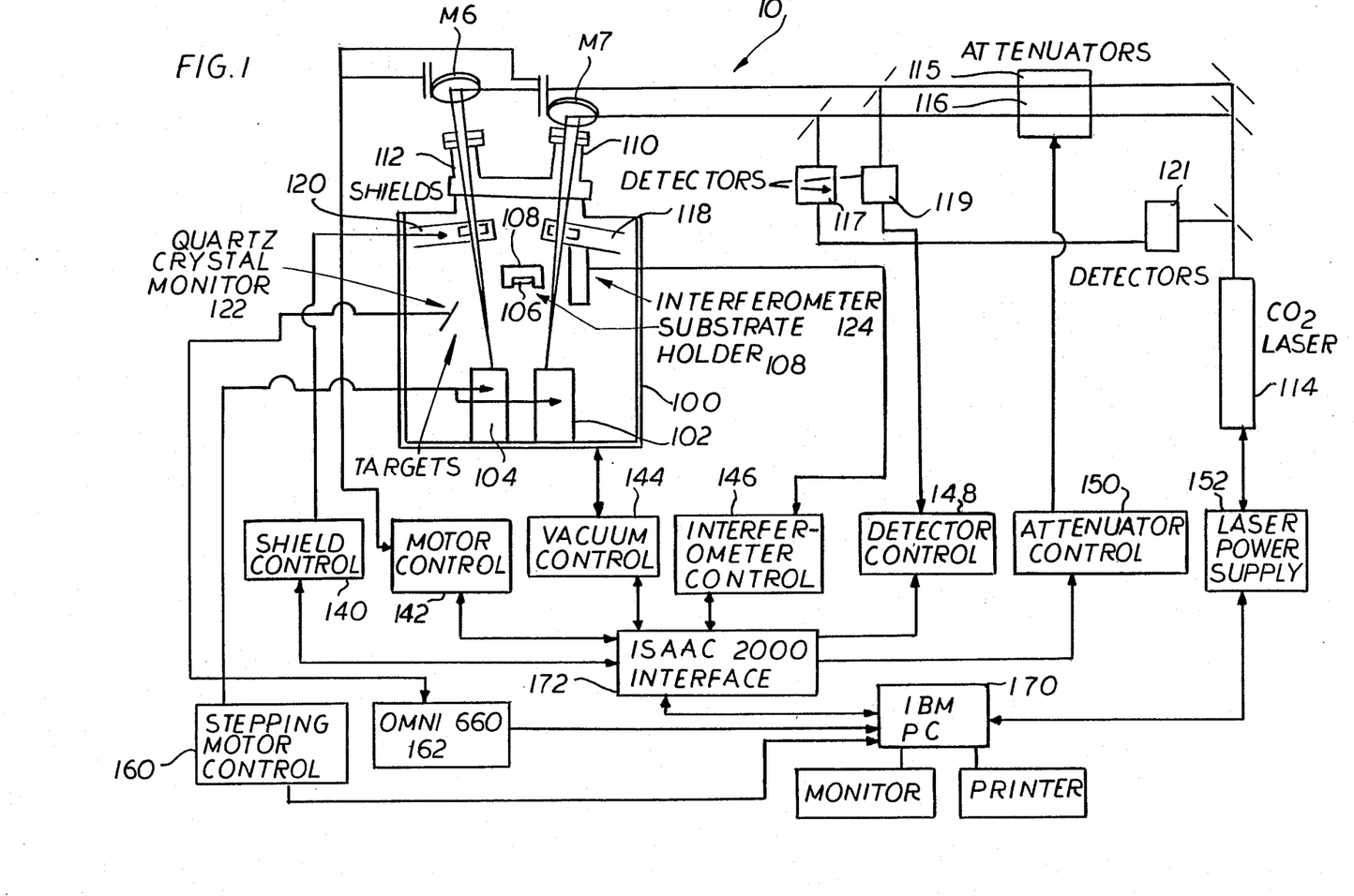
FIG. 1 is a schematic illustration of an embodiment of deposition apparatus which continuously monitors the thickness and refractive index of a deposited optical filter, and which controls the deposition parameters in a process controlled feedback loop based on the measured thickness and refractive index, to provide complex graded refractive index filters having a predetermined refractive index/thickness profile.

FIG. 1 is a schematic illustration of an embodiment of rugate deposition apparatus 10 which continuously monitors the thickness and refractive index of a deposited optical filter, and which controls the deposition parameters in a process controlled feedback loop based on the measured thickness and refractive index to provide complex graded refractive index filters having a predetermined refractive index/thickness profile. Rugate coatings may be provided which have very high reflectance and increased resistance to environmental and laser damage.

The apparatus 10 may be utilized to produce high reflectance graded refractive index (rugate) coatings on large optical surfaces. As shown in FIG. 1, the apparatus comprises a vacuum deposition chamber system 100 which includes multiple target boats or supports 102, 104 adapted to receive components which are to be evaporated for deposition in the manufacture of rugate optical filters by means of apparatus 100. The substrate 106 on which layers of continuously varying composition, blended from the target materials positioned within the holders 102, 104, is held by substrate holder 108. The target materials in the target holders 102, 104 (such as pure silicon dioxide, and pure silicon nitride, respectively) are evaporated by laser beam introduced into the vacuum chamber 100 through respective optical ports 110, 112. The laser evaporation beam is directed through the ports 110, 112 by a motorized mirror system. The laser beams are provided by laser evaporation apparatus comprising a carbon dioxide laser 114, attenuators 115, 116 and detectors 117, 119, 121, which system will be described in more detail hereinafter with respect to FIG. 2. The apparatus 10 further includes internal shields 118, 120 and a quartz crystal monitor 122.

An important feature of the apparatus 10 is heterodyning interferometer 124 which provides real time measurements for simultaneously determining the thickness and refractive index of the deposited film upon the substrate 106, as will be described in more detail hereinafter. The apparatus 10 further includes control systems for the various components including a shield control system 140 for the shields 118, 120, and a motor control 142 for directing the laser beam mirrors. In addition, a vacuum control 144 is provided to control the vacuum pump system of the vacuumized deposition chamber 100, an interferometer control system 146 is provided for the interferometer 124, a detector control system 148 is provided for the laser evaporation system detectors 117, 119, 121 and an attenuator control system 150 is similarly provided for the laser evaporation system attenuators 115, 116. In a similar manner, as shown in FIG. 1, the carbon dioxide laser 114 is provided with a laser power supply 152 for controlling the output of the laser 114. A stepping motor control 160 is utilized to position the target holders 102, 104 during evaporation of the target materials retained therein, and the output from the quartz crystal monitor is analyzed by a monitor control apparatus 162.

The shield control system 140, the motor control system 142, the vacuum control system 144, the interferometer control system 146, the detector control system 148 and the attenuator control system 150 all indirectly provide data to and receive instructions from a microprocessor control apparatus 170 through a microprocessor interface 172. The stepping motor control, the quartz crystal monitor data input and the laser power supply are all directly under the control of the microprocessor 170 as shown in FIG. 1.

While the illustrated embodiment 10 utilizes a laser flash evaporation system, rugate filters may also be fabricated using other deposition techniques such as chemical vapor deposition (CVD), and physical vapor deposition (PVD) techniques. However, using laser flash evaporation, nearly any metal, semiconductor or dielectric material system can be deposited. Also, virtually any material (at temperatures from ambient to 500° C.) can be used as a substrate, including plastics which must be kept at cool temperatures.

Substrates of large, flat and curved dimensions may be coated using systems such as the apparatus of FIG. 1. Substrates in excess of 20 inches in diameter with curvatures as low as f15 may be coated with uniform rugate films if the substrates are spun at moderate rates. Only the size of the deposition chamber limits the maximum substrate size. Rugate coatings are useful as hardened high reflectance films.

Figure 2:
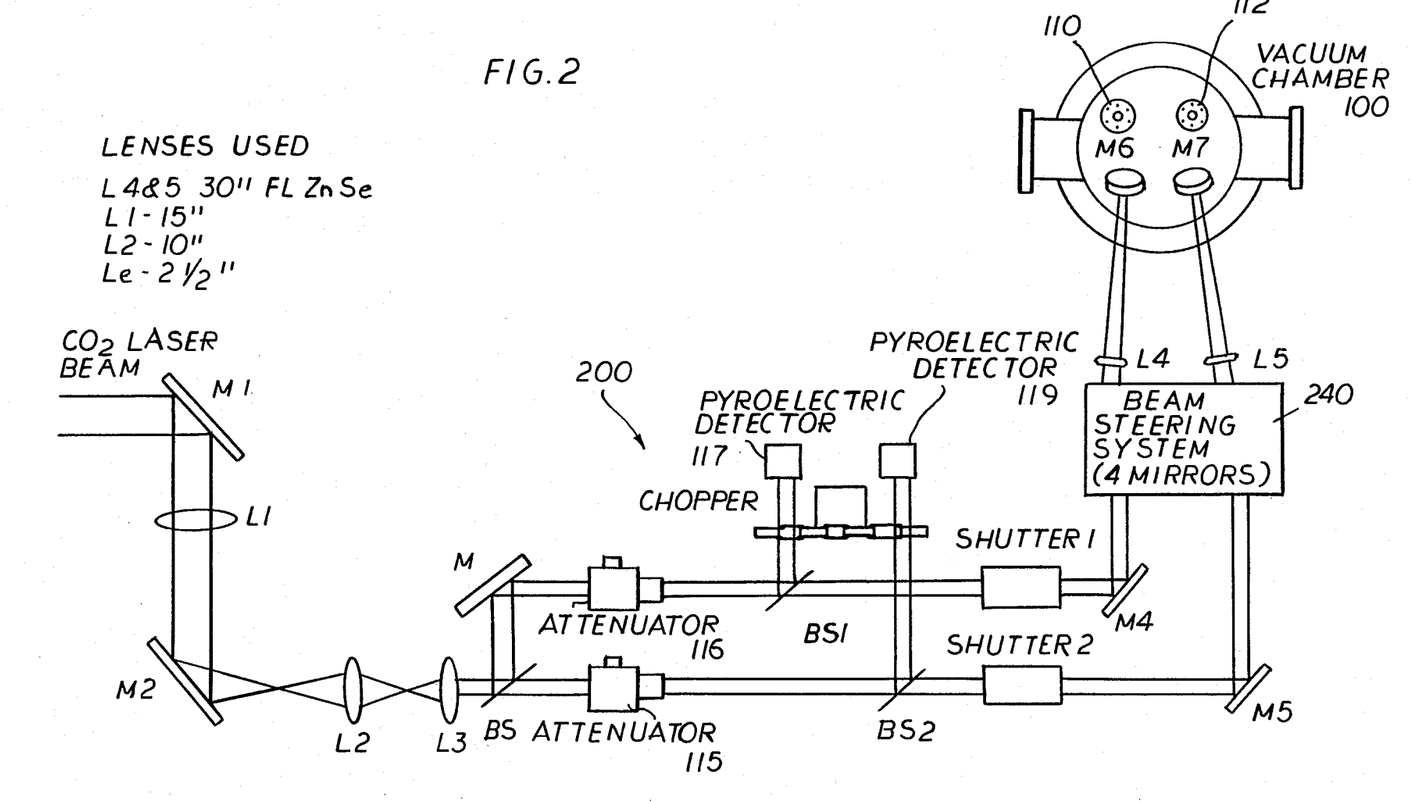
FIG. 2 is a schematic illustration of the laser flash optical system of the apparatus of FIG. 1 for rapidly and controllably evaporating optical layer materials for deposit during fabrication by means of the apparatus of FIG. 1.

The laser flash evaporation system of the apparatus 10 of FIG. 1 is shown in more detail in FIG. 2. As shown in FIG. 2, the high intensity carbon dioxide laser beam from the carbon dioxide laser 114 is directed to a first mirror M1 through a lens L1 to a second mirror M2 and lenses L2, L3 to provide a highly collimated beam which is split by beam splitter BS into two beams for respective evaporation of multiple components. The first beam is passed through attenuator 115, while the second beam is passed through attenuator 116 which are independently controlled by attenutator control 150 so that the evaporation rate produced by each respective beam is independent of the other. Beam splitters BS1, BS2 provide monitoring beams directed through a chopper apparatus through respective pyroelectric detectors 117, 119 for monitoring the intensity of the respective beams. The evaporation beams are respectively transmitted through ports 110 and 112, and reflected by mirrors M4, M5 to a 4-mirror beam stirring system 240, through respective lenses L4, L5 to mirrors M6, M7 and through the ports 110, 112 of the vacuum chamber system 100.

The computer-controlled Apollo 575W tunable $CO_2$ laser 114 (CW/pulsed/chopped/Q-switched) mounted to the bottom of a 4 foot by 6 foot NRC optical table (with vertical and horizontal isolation legs) is used as the laser source for deposition. All transmitting optics are ZnSe. Mirrors are 99% reflective, coated Pyrex. The CW/pulsed $CO_2$ laser 114 provides high deposition rates and fine control of the deposition process.

The laser beam is steered up and onto the top of the table where it is deflected into the optical path. The resulting 8 mm diameter laser beam is then directed by mirrors M1 and M2 through the beam attenuation optical path. Before attenuation, 5% of the beam is diverted to a calorimeter detector that measures the power of the laser output. This power reading is fed into the control computer 170, and feedback to the laser maintains a constant laser output. The resulting 95% of the light is focused and recollimated.

As shown in FIG. 2, the laser beam is split into two equal components and guided through shutters. Both beams pass through CdTe modulator attenuators 115, 116 to control the power levels of each leg independently. The CdTe modulators rotate the polarization of incoming light as voltage is applied across the crystal. Computer-controlled 0–10,000 V power supplies are used to drive the modulators. The emerging light then passes through a polarizer which causes attenuation of the beam as its polarization changes.

To control the laser power to the deposition materials (power will be different for the two beams), the pyroelectric detectors 117 and 119 (2 J max. energy, $S/N = 10^6$) sample 5% of each component beam and input their readings to a computer for control of the attenuation levels of the two beams using the input readings and index and thickness information.

The beam steering system (two mirrors for each beam with x, y, z mounts) guides the laser beams to positions above the chamber 100. The beams are then reflected through the top laser ports by mirrors M6 and M7. In the illustrated embodiment, lenses of 30 in. focal length focus the laser beams onto the deposition materials. These materials are evaporated onto the substrate 106 placed 14 in. above the targets.

The two rotating shields 118, 120 protect the laser ports 110, 112 from deposition. The shield window rotates past a small window area. When that area is coated, a clean window section is rotated to the opening, allowing the laser intensity to be reduced by only a miniscule amount.

Two mechanisms work together to expose fresh source material to the laser beam: the sources are rotated and the laser beam is rastered across the source. The source is stepped slowly around at an empirically determined speed to give a maximum deposition rate. After each revolution, a mirror outside the vacuum system diverts the laser beam to a new position resulting in illumination of a new concentric circle on the source. This sequence is repeated until the deposition is complete.

Different refractive indices in the evaporated material deposited on the substrate 106 are obtained by varying the stoichiometry of a deposited material system. The composition of the deposited mixture is controlled by varying the evaporation rates from the two material sources. The evaporation rate can be controlled by controlling laser output power, pulsed beam pulse width and/or pulse repetition frequency.

The choice of a particular control parameter or combination of parameters can affect the overall deposition rate and the composition of the species nucleating on the substrate. Controlling the deposition rate by adjusting the power incident on the source is analogous to direct thermal evaporation where the source is conventionally heated by resistive or e-beam heating, except that only a small portion of the source is heated and a fresh area of unperturbed composition can be continuously chosen for irradiation by scanning the beam across the source surface. The use of this technique to control evaporation rate can in some cases lead to decomposition of the source material. Whether the desired stoichiometry in the film can be obtained will depend on the mixing of atomic constituents in the vapor phase and the mobility of atomic species on the substrate prior to nucleation.

In accordance with conventional practice, compounds having the same composition as the source material have been deposited by control of the pulse rate. To obtain films congruent with the starting material the pulses should be fast enough to prevent decomposition of target material during heating. Therefore, to evaporate molecular species, the peak power pulses should be high enough to flash the molecular species from the target surface in one or a few pulses.

While the refractive index can be controlled by varying the mixing ratio of molecular species on the substrate, considerations other than the refractive index may influence the desired form of the deposited material. Laser output power, pulse width, and pulse repetition frequency all have strong influences on the physical state of a deposited material. For example, long-term compositional stability, mechanical properties and physical integrity of the film can be enhanced by selecting the form of deposition rate control.

In operation of the illustrated embodiment, the Apollo 575 $CO_2$ laser 114 output beam is diffraction-limited and vertically polarized. The minimum spot size of the 8 mm beam when passed through a 30 inch focal length lens, and from the focal length and diameter (from $r_s = 2F\lambda/\pi w$) is 0.64 mm. For operation at 20 W (average) power reaching each target, the peak laser power density at the target is 6.2 kW/cm$^2$, 31 kW/cm$^2$ or 180 kW/cm$^2$, depending on whether the laser is operating CW, pulsed or Q-switched, respectively. The laser power at the target is controlled by computer system 170, 150, 152 by applying appropriate voltages to the power supply driving the CdTe modulators.

Minimum pressure of the illustrated system is $5 \times 10^{-9}$ torr. Typical base pressure for the chamber is $2 \times 10^{-7}$ torr, and deposition pressure is typically varied from $7 \times 10^{-7}$ torr to $2 \times 10^{-6}$ torr.

For a source-to-substrate separation of 14 inches and a laser power of 400 W, the maximum deposition rate is usually between 1000 Angstroms/min and 2000 Angstroms/min. Typical rates during deposition have averaged between 400–600 Angstroms/min.

Both deposition rate and film quality can be affected dramatically by the particle size of the source material. The use of pressed discs as sources resulted in no deposition due to the high thermal conduction away from the irradiated spot, while fine powder proved problematic because of powder eruption. The most satisfactory source configuration that deposited good quality films was 1–2 mm size lumps of powder.

In deposition operation, the substrate can be maintained at temperatures between 23° C. and 500° C. (depending on the temperature limits of the substrate material and/or desired deposition temperature) allowing in situ annealing of the film.

Figure 3:
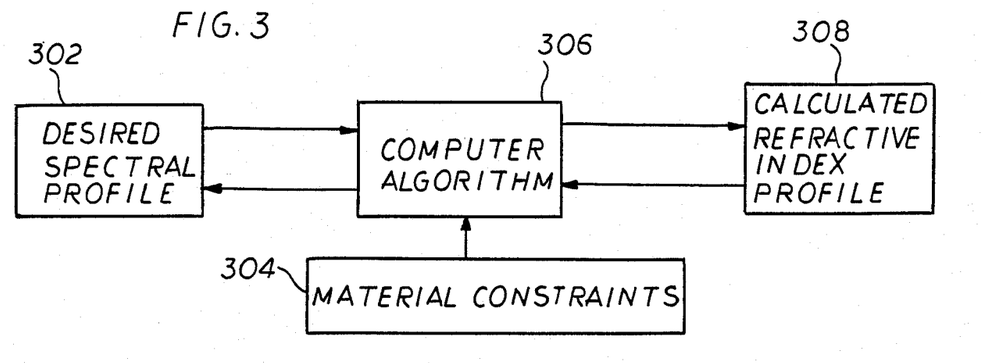
FIG. 3 is a schematic flow diagram of a system for determining the complex thickness/refractive index profile for a graded refractive index optical filter to be fabricated by means of the apparatus of FIG. 1.
Figure 4:
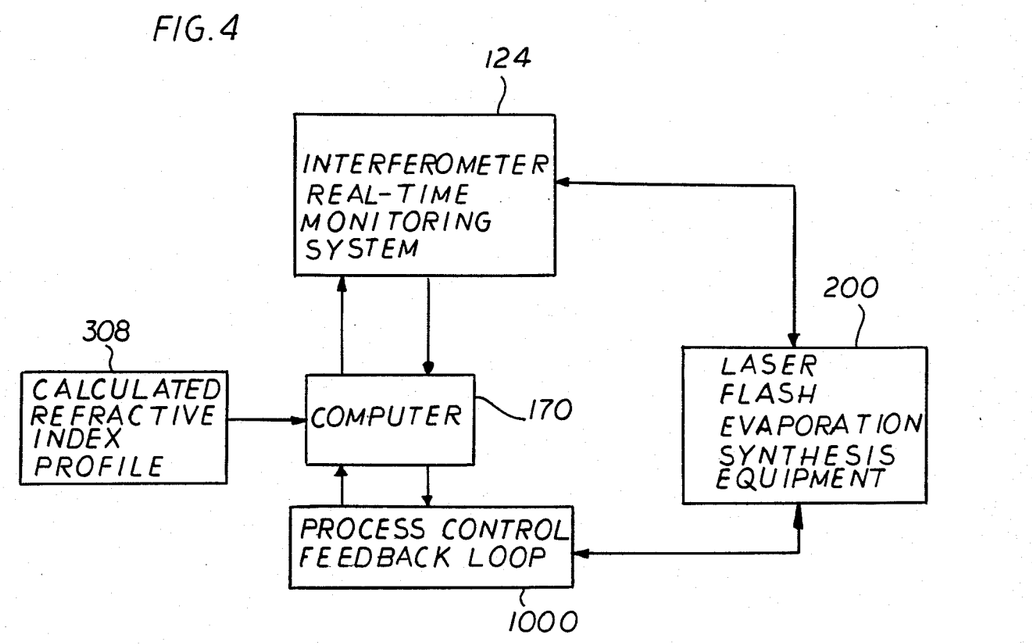
FIG. 4 is a schematic flow diagram of the graded refractive index fabrication system in accordance with the present invention.
Figure 5:
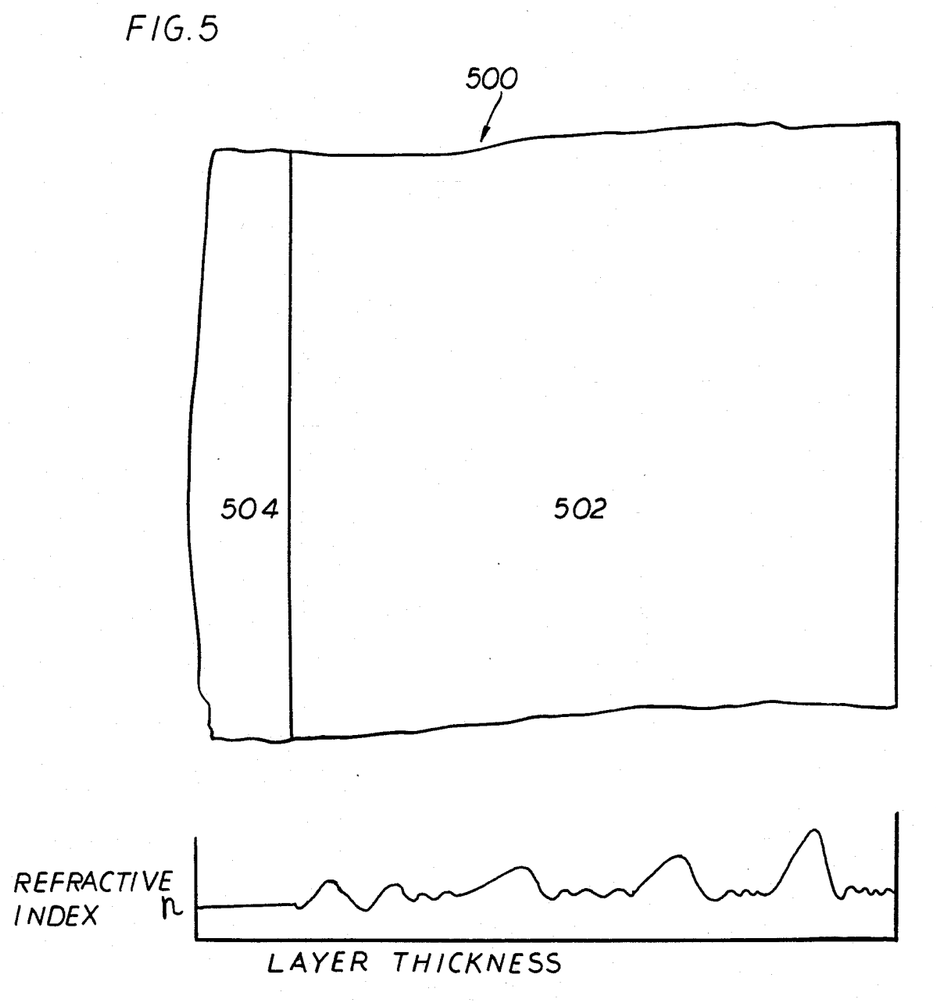
FIG. 5 is an enlarged cross sectional view, partially broken away, of an embodiment of graded refractive index complex optical schematic filter together with a graphic representation of refractive index of the substrate and optical filter layer in registration with the thickness dimension of the layer.

As previously discussed, the desired refractive index profile for a given material system may be calculated from the desired spectral profile of the optical filter by means of an appropriate computer algorithm. The method of calculation is schematically illustrated in FIG. 3. In this regard, the desired spectral profile date 302 (such as the desired filter performance data for a particular input spectrum) and the material constraint data 304 (such as the transmission and refractive index properties of the component materials and intermediate compositions prepared therefrom) may be processed by an appropriate computer algorithm to provide a calculated refractive index profile for fabrication of an optical filter device having the desired spectral profile within a predetermined degree of accuracy. As shown schematically in FIG. 4, the calculated refractive index profile data 308 may be utilized to control the operation of rugate fabrication apparatus to produce the desired optical filter. In this regard, the index profile data 308 may be introduced into a control computer 170 which controls the laser flash evaporation synthesis equipment by means of a process control feedback loop system utilizing data from the real time interferometric measurement of deposit thickness and refractive index to control the deposition process to provide an optical filter having the desired refractive index profile and optical performance. In this regard, illustrated in cross-section in FIG. 5, in greatly enlarged form, is a rugate filter 500 of arbitrary refractive index variation with thickness. The rugate coating 502 of varying composition, such as may be deposited under control of apparatus 10 to prescribed parameters as previously described, is deposited on a suitable substrate 504 of constant dielectric constant. As shown in FIG. 5, the index of refraction (r) of the deposited rugate coating 502 may be varied smoothly and arbitrarily within the limits of the material system components being deposited.

Figure 6:
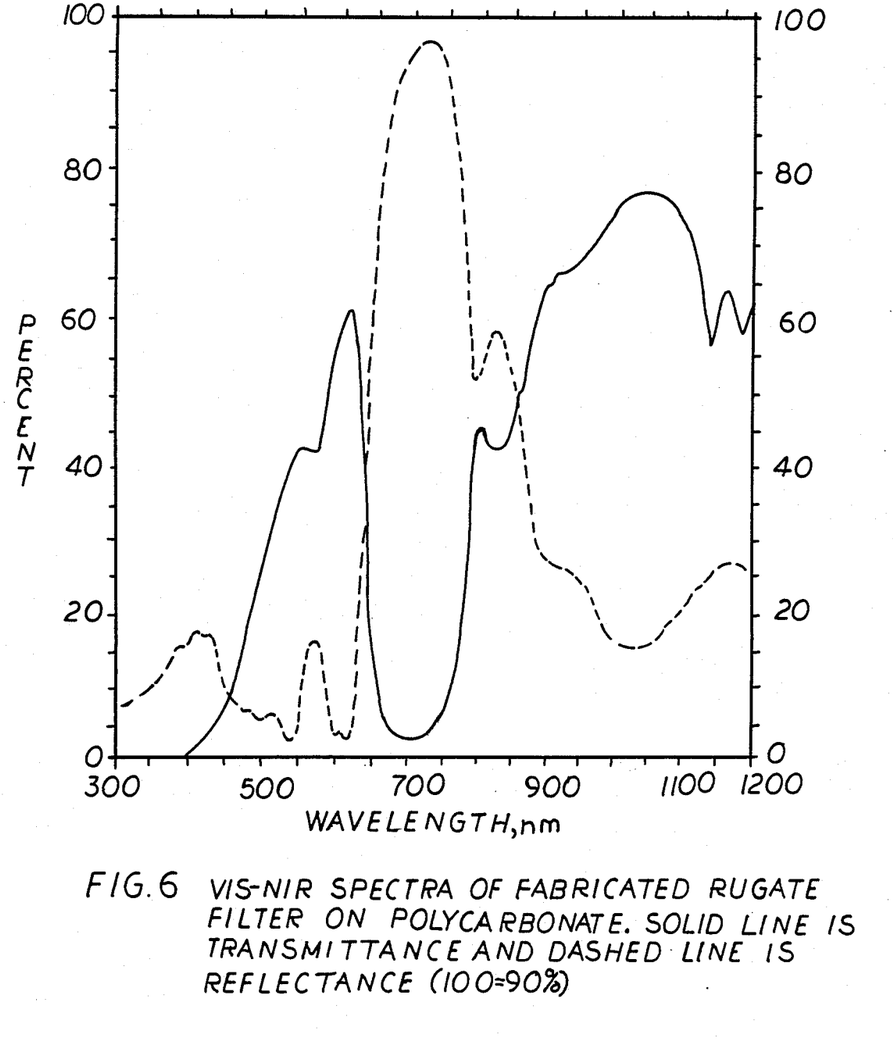
FIG. 6 is a graphical representation of the visible and near infrared spectra of an embodiment of a fabricated complex rugate filter, illustrating transmittance of the filter by solid line and reflectance of the filter by dotted line.

Rugate filters having desirable optical properties may be readily provided in accordance with the present invention. In this regard, illustrated in FIG. 6 are the visible-near infrared spectra of a fabricated rugate filter which has been deposited on a polycarbonate plastic substrate.

As previously discussed, the heterodyning, real-time interferometer for simultaneously determining physical thickness and optical thickness (and therefore, index of refraction) is an important part of the apparatus of FIG. 1. Such interferometers may also find significant use in other deposition and film measurement systems and applications.

Figure 8A:
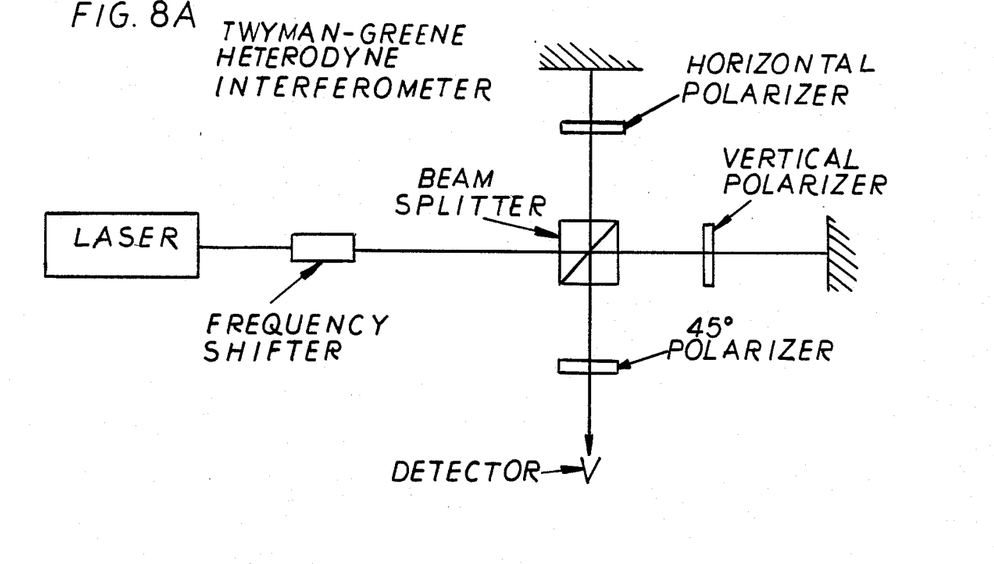
FIGS. 8A and 8B are, respectively, schematic illustrations of a Twyman-Ggeene heterodyne interferometer and the operation of the spinning halfwave plate and quarterwave plate components of the thickness monitor of FIG. 7.
Figure 8B:
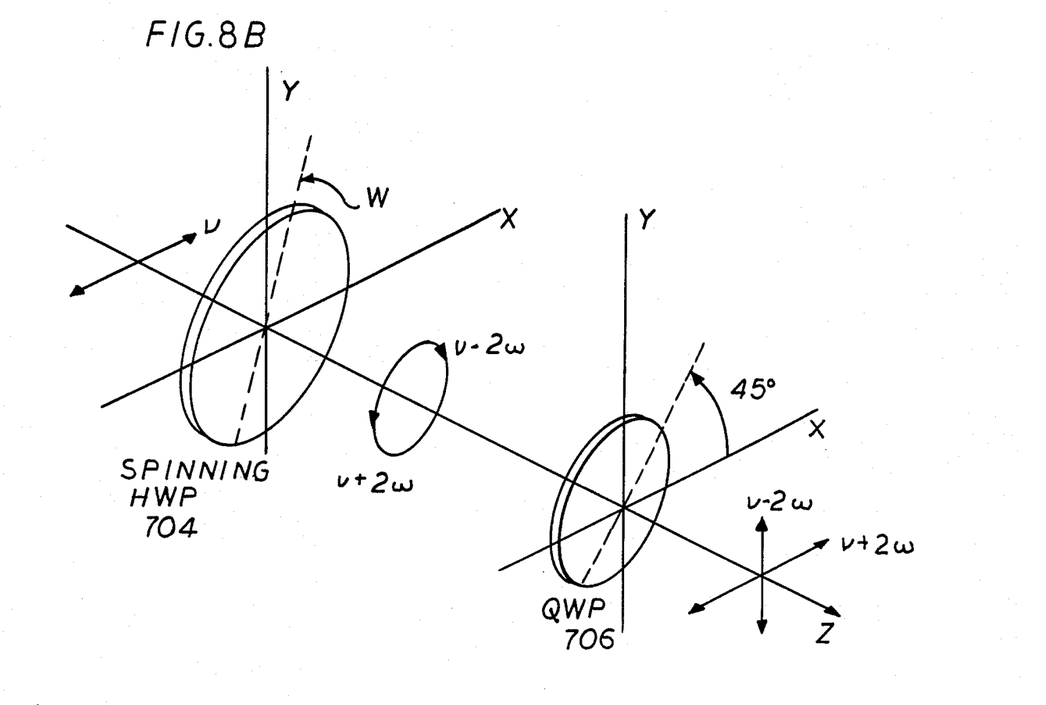

As shown in FIGS. 8A, and 8B respectively (G.E. Sommargren, JOSA, 65, 960, 1975), incoming linearly polarized light of optical frequency $\nu$ selected to be within the functional spectral range of the optical filter device which is to be fabricated, impinges on a half-wave plate 704 spinning at frequency $\omega$. This causes the polarization vector to spin at $2\omega$. The incoming linearly polarized light responds as the linear combination of right and left circularly polarized light whose polarization vectors are rotating at $\nu$, such that the spinning half-wave plate 704 upshifts the rotation rate of the left circularly polarizing vector by $2\omega$ and downshifts the rotation rate of the right circularly polarized light by the same amount. When this light is passed through a quarter-wave plate 706 with axis oriented at 45°, The result is orthogonal linear polarization, one upshifted and the other downshifted by 2.

In the interferometer 124, as shown in FIGS. 8A, and 8B respectively the polarized laser light is passed through a frequency shifter as described above, and directed into a Twyman-Greene type interferometer with a polarization neutral beam splitter. In the illustrated embodiment, vertical polarization is selected in the reference leg, and horizontal polarization is selected in the sample leg. After recombining at the beam splitter, a parallel component of each beam is transmitted to the detector through a linear polarizer at 45°. Since these two beams are separated in frequency by virtue of the frequency shifter, a beat or heterodyne signal is seen by the detector. The phase of this signal with respect to that of a signal picked off the incoming beam depends on the relative optical paths of the sample and reference legs. Thus, a change in optical thickness of the sample of $\frac{1}{4}$ wavelength will cause a 360° phase shift in the heterodyne signal since the interferometer is double pass.

Figure 7:
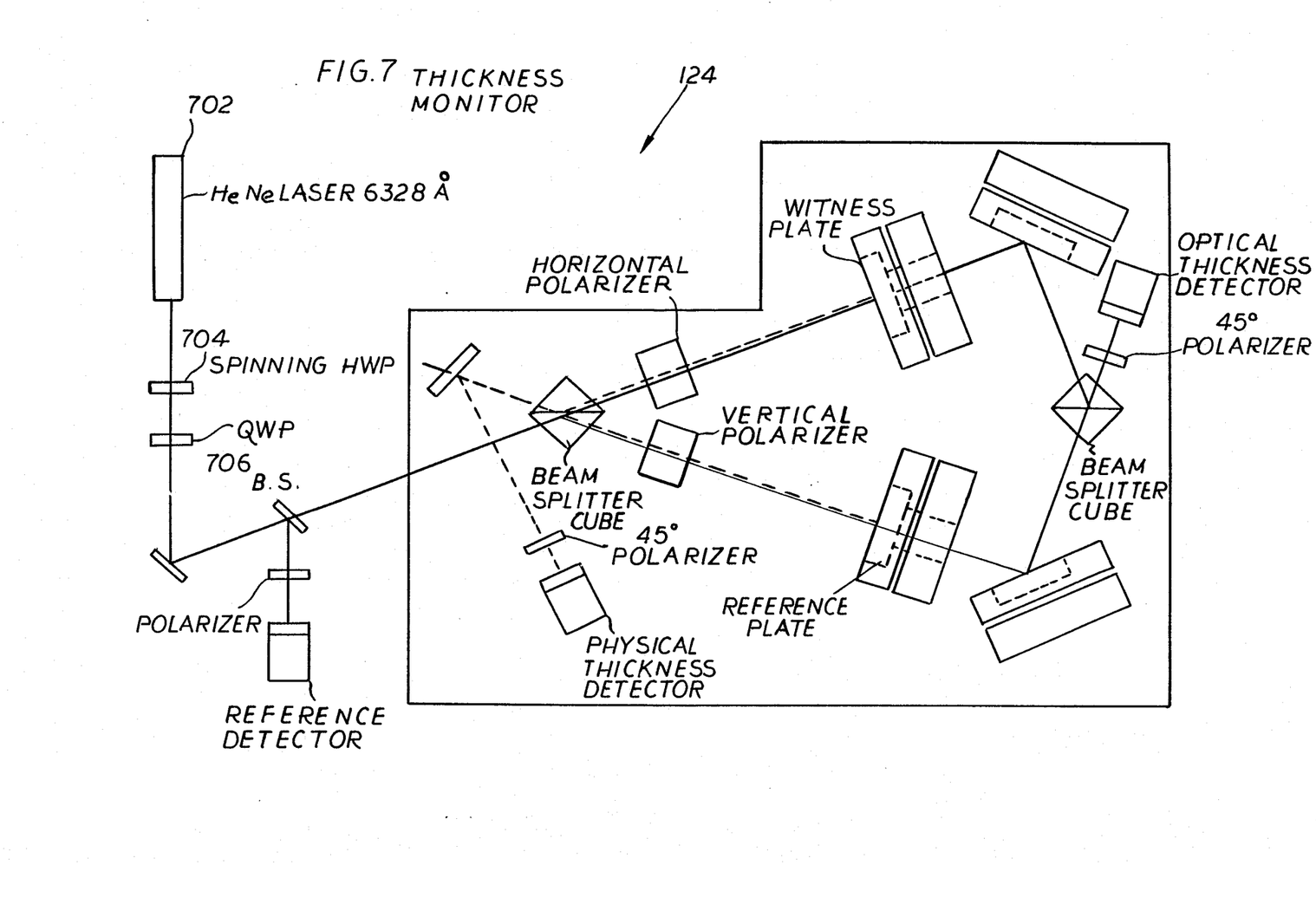
FIG. 7 is a schematic view of the thickness monitor of the apparatus of FIG. 1 for continuously and simultaneously measuring both thickness and refractive index during fabrication of an optical filter.

The thickness monitor 124 utilizing these principles is shown in FIG. 7. The thickness and refractive index data provided by the optical monitor is used in the laser flash evaporation system to control the deposition in real time. The laser beam passes through the frequency shifter and a small portion is diverted by a beam splitter to establish the reference signal. The beam is then directed into the deposition chamber through a high quality fused silica window and steered to the beam splitter. The sample and reference beams are steered to the sample and reference substrates by four mirrors and the appropriate polarizers. The retro-reflected beams recombine at the beam splitter and are detected at the physical thickness detector. The transmitted beams also recombine at the beam splitter and are detected at the optical thickness detector.

As the film grows on the sample substrate, the path length in the retro-reflected sample beam decreases by 2t and the path length of the transmitted sample beam increased by $(n-1)t$. The resultant phase shift is read by phase meters with an accuracy of ±0.1 degrees. The values of n and t are calculated from these phase shifts throughout the entire deposition.

The illustrated heterodyne interferometer 124 (FIGS. 1, 7) measures both physical thickness and optical thickness in situ, and in real time. The measurements are carried out for each incremental layer, thereby minimizing cumulative errors. The measurement accuracy is estimated to be in the 20–30 Angstrom range.

The optical monitor can be used with almost a wide variety of materials which have at least limited transmission. The physical thickness leg of the interferometer can be used with metallic materials also.

In accordance with the present invention, the composition, deposited thickness and refractory index may be rapidly and accurately monitored and controlled to deposit films which have a predetermined compositional variation along the thickness of the film. This compositional variation in turn provides a graded refractive index profile resulting in desired spectral properties.

To deposit rugate structures, the individual components of a material system are evaporated and subsequently deposited at varying rates, under control of the feedback control system and the measured physical and optical thickness values, which are provided to the real time monitor system. The system has demonstrated a precision of $\mp 0.2$ degrees of phase or $\pm 3$ Angstroms and an accuracy of better than $\pm 1\%$ on deposited films.

The use of laser flash evaporation processes for the deposition of thin films may be carried out in a pulsed, or continuous (CW) manner, with the evaporation and corresponding deposition controlled by the laser pulse rate, pulse width and/or intensity. The flash evaporation is easily precisely controlled, with the deposition process stopping substantially immediately with cessation of the laser energy input. Very high rates of deposition may be provided, depending on the material to be evaporated. Contamination free films may be deposited, and the substrate may be maintained at room temperature. Most refractory materials, including substantially all materials that can be deposited by conventional PVD methods may be deposited by Laser Flash Evaporation techniques. Laser flash evaporation processes also produce a minimization of pressure rise in the vacuum chamber, which permit the deposition of thin films in ultra high vacuum. Depending on the particular deposition conditions, reactive sputtering may be conducted in laser flash evaporatin systems. On the other hand, laser flash evaporation may be carried out with elimination of deleterious static charges at high active gas pressures. Laser flash evaporation may also be carried out under conditions which are favorable for the growth of epitaxial layers, and provide for reduction of impurity deposition to a minimum due to inherent cleanliness of the process.

In operation, the interferometer, quartz crystal monitor, and the laser detectors provide information to the computer. These measured values of index, thickness and laser power are compared to theoretical values. Error and change algorithms then drive the $CO_2$ laser and attenuators to give the proper deposition rates of the two source materials which produce the predetermined, desired index of refraction and thickness. The sources, laser port shields, and beam raster mirrors are moved and adjusted to give maximum deposition rate. Vacuum pumpdown and control is also automatic. The system utilizes the starting parameters and a starting prompt to fabricate the desired rugate filter.

What is claimed is:

1. A method for fabricating a rugate filter comprising the steps of
   providing a predetermined refractive index-thickness profile for a rugate filter,
   providing a plurality of at least two different compatible thin film deposition source components of different refractive index which are stoichiometrically combinable in variable proportions to form a thin film material having a refractive index which varies as a function of the proportion of said thin film components therein,
   separately laser flash evaporating each of said plurality of source components and co-depositing said thin film source components on a substrate to form a coating on said substrate of varying composition and refractive index while simultaneously monitoring the physical thickness and optical thickness of the coating to provide measured physical thickness and optical thickness values of the coating,
   comparing the measured physical thickness and optical thickness values with said predetermined refractive index-thickness profile during deposition, and
   adjusting the respective laser flash evaporation rates of said thin film deposition components with reference to the measured physical thickness and optical thickness values and said predetermined profile to conform the physical and optical thickness profile of the deposited coating with the predetermined profile.

2. A method in accordance with claim 1, wherein said simultaneous monitoring of the physical thickness and optical thickness values of the coating is carried out by heterodyning interferometric monitoring.

3. A method in accordance with claim 2 wherein one of said source components is silicon nitride and wherein a different one of said source components is a silicon oxide and wherein said deposited coating comprises a stoichiometric mixture of varying layer composition.

4. A method in accordance with claim 2 wherein one of said source components is zinc sulfide and wherein a different one of said source components is zinc selenide, and wherein said deposited coating comprises a stoichiometric mixture of varying layer composition.

5. A method in accordance with claim 2 wherein one of said source components is aluminum oxide and wherein a different one of said source components is aluminum nitride, and wherein said deposited coating comprises a stoichiometric mixture of varying layer composition.

* * * * *

UNITED STATES PATENT AND TRADEMARK OFFICE
CERTIFICATE OF CORRECTION

PATENT NO. : 4,837,044
DATED : June 6, 1989
INVENTOR(S) : MURARKA, ET AL.

Page 1 of 2

It is certified that error appears in the above-identified patent and that said Letters Patent is hereby corrected as shown below:

In the Face Articles, change "Technol" to --Technol.",--.

In the Abstract, Line 2, change "(rugate," to --(rugate)--.

In the Abstract, Line 3, change "verses" to --versus--.

In the Abstract, Line 5, change "compatable" to --compatible--.

In Column 2, Line 8, change "determinationof" to --determination of--.

Column 2, Line 65, change "Twyman-Ggeene" to --Twyman-Greene--.

Column 3, Line 15, change "inphase" to --in-phase--.

Column 3, Line 56, change "gaussian" to --Gaussian--.

Column 4, Line 67, change "(N₄)" to --(Na)--.

Column 5, Line 11, change "achieveable" to --achievable--.

Column 5, Line 43, after "variation" insert a comma.

Column 7, Line 13, change "attenutator" to --attenuator--.

Column 9, Line 33, change "date" to --data--.

Column 10, Line 10, after "8A" delete the comma.

UNITED STATES PATENT AND TRADEMARK OFFICE
CERTIFICATE OF CORRECTION

PATENT NO. : 4,837,044

DATED : June 6, 1989

INVENTOR(S) : Murarka, et al.

It is certified that error appears in the above-identified patent and that said Letters Patent is hereby corrected as shown below:

Column 10, Line 24, change "The" to --the--.

Column 10, Line 27, after "8A" delete the comma.

Column 10, Line 28, after "respectively" insert a comma.

Column 11, Line 25, change "$\overline{+}$" to --$\underline{+}$--.

Column 11, Line 46, change "evaporatin" to --evaporation--.

Signed and Sealed this

Thirteenth Day of March, 1990

Attest:

JEFFREY M. SAMUELS

*Attesting Officer*  *Acting Commissioner of Patents and Trademarks*